(12) United States Patent
Miller et al.

(10) Patent No.: US 6,400,012 B1
(45) Date of Patent: *Jun. 4, 2002

(54) HEAT SINK FOR USE IN COOLING AN INTEGRATED CIRCUIT

(75) Inventors: William J. Miller, Blackwood; Imran A. Bhutta, Marlton, both of NJ (US)

(73) Assignee: Advanced Energy Voorhees, Inc., Voorhees, NJ (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/932,308

(22) Filed: Sep. 17, 1997

(51) Int. Cl.[7] .............................. H01L 23/34; H05K 7/20
(52) U.S. Cl. ......................................... 257/712; 361/697
(58) Field of Search ................................. 257/712, 714, 257/719; 361/689, 697, 703

(56) References Cited

U.S. PATENT DOCUMENTS

| | | | |
|---|---|---|---|
| 4,450,472 A | 5/1984 | Tuckerman et al. | 357/82 |
| 4,573,067 A | 2/1986 | Tuckerman et al. | 357/82 |
| 4,712,158 A | 12/1987 | Kikuchi et al. | |
| 4,765,397 A | 8/1988 | Chrysler et al. | |
| 4,894,709 A | 1/1990 | Phillips et al. | 357/82 |
| 5,002,123 A | 3/1991 | Nelson et al. | |
| 5,003,376 A * | 3/1991 | Iversen | 361/689 |
| 5,021,924 A | 6/1991 | Kieda et al. | 361/385 |
| 5,111,280 A * | 5/1992 | Iversen | 257/714 |
| 5,151,777 A * | 9/1992 | Akin et al. | 257/712 |
| 5,210,440 A | 5/1993 | Long | 257/675 |
| 5,239,200 A | 8/1993 | Messina et al. | 257/714 |
| 5,453,911 A * | 9/1995 | Wolgemuth et al. | 361/689 |
| 5,514,906 A | 5/1996 | Love et al. | 257/712 |
| 5,606,201 A | 2/1997 | Lutz | |
| 5,666,269 A * | 9/1997 | Remero et al. | 361/699 |
| 5,719,444 A * | 2/1998 | Tilton et al. | 257/714 |

FOREIGN PATENT DOCUMENTS

| | | | |
|---|---|---|---|
| DE | 37 44 353 C1 | 4/1989 | |
| JP | 550153359 | 11/1980 | |
| JP | 62-195157 | 8/1987 | |
| JP | 63-15451 | * 1/1988 | 257/714 |

OTHER PUBLICATIONS

R. Hahn et al. "High Performance Liquid Cooled Microchannel Heat Sinks"., International Microelectronics and Packaging Society Procedings., Apr. 1997, pp. 3–5., TU Berlin Technolglen der Mikropariphanik.

Pon R. Ponnappan, Ph.D., "Liquid–Cooled Venturi Type Heat Sink for High Heat Flux Electronics Cooling Applications"., International Microelectronics and Packaging Society Procedings., Apr. 1997, Total pages 3.

* cited by examiner

Primary Examiner—Olik Chaudhuri
Assistant Examiner—Howard Weiss
(74) Attorney, Agent, or Firm—Blakely, Sokoloff, Taylor & Zafman, LLP

(57) ABSTRACT

An apparatus for removing heat from an electronic component. In one embodiment, a heat generating device is mounted to a top-side surface of a package substrate. A fluid flow channel that is defined at least partially by a portion of the back-side surface of the substrate is provided for passing a cooling medium. This configuration permits the cooling medium to be in direct contact with the back-side surface of the substrate, thus, reducing the overall thermal resistance between the heat generating device and cooling medium.

18 Claims, 9 Drawing Sheets

HEAT SINK FOR USE IN COOLING AN INTEGRATED CIRCUIT

FIELD OF THE INVENTION

The present invention relates to an apparatus for cooling high power electronic devices.

BACKGROUND OF THE INVENTION

Semiconductor devices, such as integrated circuits, power field effect transistors, and the like, are typically attached to a dielectric substrate containing one or more electrical interconnection layers. The substrate is generally made of a ceramic, plastic, or other organic material. The substrate includes an electrical interconnection network that permits the semiconductor device to be electrically coupled to other devices residing either on or off the substrate. The substrate also provides structural support for the semiconductor device. Generally speaking, a substrate containing one or more semiconductor devices is referred to as a "package".

FIG. 1 illustrates a conventional package wherein a semiconductor device 10 is attached to the surface of a substrate 12. A solder or thermal adhesive 14 is generally used to attach or couple device 10 to substrate 12. In order to facilitate the removal of heat away from device 10, some packages include a heat slug 16 that is thermally coupled to the back-side of substrate 12 by a thermal adhesive 18.

In high power applications, the attachment of a heat slug to the back-side surface of the package substrate is not sufficient to maintain the semiconductor device within allowable operating temperatures. To increase the rate of heat transfer from high power devices, liquid cooled heat sinks have been attached to the back-side surface of the package substrate. (See FIG. 2). As shown in FIG. 2, a conventional liquid cooled heat sink 30 generally includes a housing 32 containing a flow channel 36 of a uniform cross-section that directs a cooling fluid through the heat sink. Heat is conducted away from device 10 through a solder layer 14, substrate 12, adhesive film 18 and heat sink housing 32. The heat is ultimately removed by convection heat transfer into the cooling medium passing through channel 36.

As integrated circuit technology has improved, substantially greater functionality has been incorporated into the devices. And as integrated circuits have expanded in functionality, the size of the devices have also diminished resulting in higher clocking frequencies and increased power consumption. As a consequence, the integrated circuit devices of today generate more heat while possessing smaller surface areas to dissipate the heat. Therefore, it is important to have a high rate of heat transfer from the integrated circuit package to maintain the junction temperatures of the integrated circuit within safe operating limits. Excessive junction temperatures may affect the performance of the circuit and cause permanent degradation of the chip. Other types of semiconductor devices, such as power field effect transistors, consume extremely high amounts of power (typically in the range of 1 to 3 kilowatts). These devices also require a high rate of heat transfer away from the devices in order to maintain their junction temperatures within safe operating limits. Although conventional liquid cooled heat sinks have proved sufficient in the past, the inherently high thermal resistance path between the heat dissipating device and the cooling medium makes them unsuitable for many of the high power consuming components of today.

Therefore, what is needed is an apparatus that is capable of cooling high power semiconductor devices.

SUMMARY OF THE INVENTION

An apparatus for removing heat from an electronic component, such as a semiconductor device, is disclosed.

In one embodiment, a semiconductor device is mounted to a top-side surface of a substrate. A fluid flow channel that is defined at least partially by a portion of the back-side surface of the substrate is provided for passing a cooling medium. This configuration permits the cooling medium to be in direct contact with the back-side surface of the substrate, thus, reducing the overall thermal resistance between the semiconductor device and cooling medium.

In another embodiment, the fluid flow channel is divided into at least two regions. The first region is located near the channel inlet, whereas the second region is positioned adjacent the back-side surface of the substrate at a location opposite the heat generating semiconductor device. The cross-sectional flow area of the second region is less than the overall cross-sectional flow area of the first region. The reduced channel flow area within the second region causes the fluid flow velocity to be increased, thus, enhancing the convection heat transfer within the second region.

In accordance with the present invention, one or more reduced flow area regions may be strategically positioned within a cooling channel that is located below a substrate containing one or more heat generating components. The reduced flow area regions of the channel are positioned adjacent the back-side surface of the mounting substrate at locations just opposite the high heat generating components located along the top-side of the substrate. Among other benefits, this feature permits the thermal performance of the heat removal system to be optimized.

BRIEF DESCRIPTION OF THE DRAWINGS

The present invention is illustrated by way of example and is not limited by the figures of the accompanying drawings, in which like references indicate similar elements, and in which.

DETAILED DESCRIPTION

An apparatus for removing heat from a heat generating component is described. In the following description, numerous specific details are set forth such as material types, dimensions, process steps, etc., in order to provide a thorough understanding of the present invention. However, it will be understood to one of skill in the art that the invention may be practiced without these specific details. In other instances, well known elements and processing techniques have not been shown in particular detail in order to avoid unnecessarily obscuring the present invention. This discussion will mainly be limited to those needs associated with removing heat from semiconductor devices that are attached to a mounting substrate. It will be recognized, however, that such focus is for descriptive purposes only and that the apparatus of the present invention are applicable to other types of electronic devices and other forms of packaging.

Figure 1:
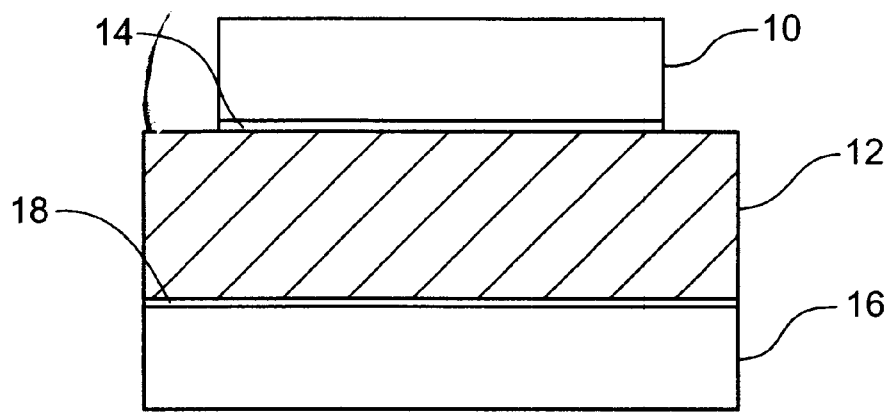
FIG. 1 illustrates a prior art semiconductor package having a heat sink attached to the bottom surface of the package.
Figure 2:
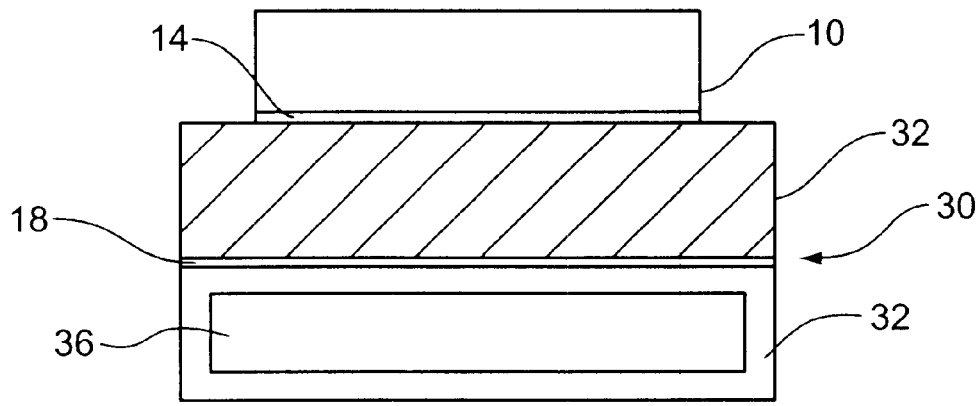
FIG. 2 illustrates a semiconductor package attached to a prior art liquid cooled heat sink.
Figure 3A:
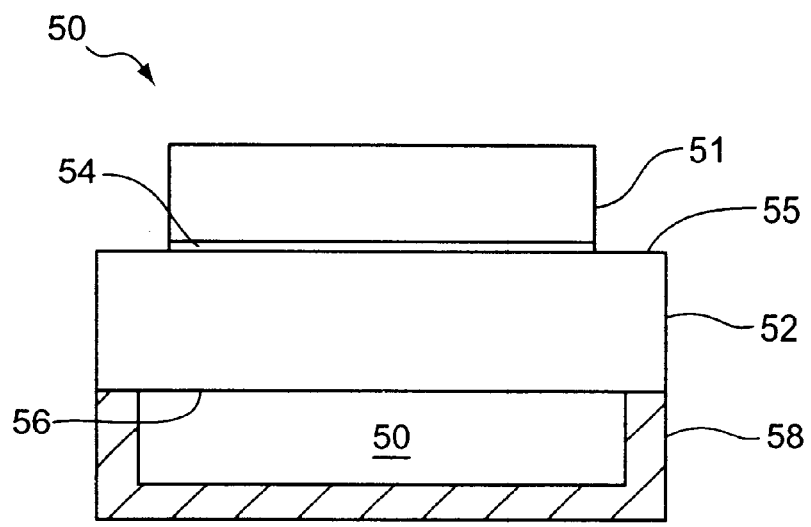
FIG. 3A illustrates a cooling apparatus in accordance with one embodiment of the present invention.

FIG. 3A illustrates a cross-section view of a cooling apparatus 50 in one embodiment of the present invention. Apparatus 50 includes a substrate 52 having a semiconductor device 51 mounted onto the top-side surface 55 of the substrate. In one embodiment, semiconductor device 51 is mechanically and electrically coupled to the top surface 55 of substrate 52 via a solder connection 54. A thermal adhesive, or other thermally conductive material, may also be used to attach device 51 to substrate 52. It is appreciated that the present invention is not limited to the manner in which semiconductor device 51 is thermally and/or electrically coupled to substrate 51. In accordance with the present invention, a fluid flow channel 60 that is defined at least partially by the back-side surface 56 of substrate 52 is provided for passing a cooling medium. A cooling channel housing 58 defines the remaining portion of channel 60. By permitting the cooling medium to be in direct contact with the back-side surface 56 of substrate 52, the overall thermal resistance between the cooling medium and device 51 is effectively reduced. By minimizing the thermal resistance between the cooling medium and semiconductor device 51, the present invention provides an electronic package with enhanced thermal performance.

Substrate 52 is typically made of a dielectric material, such as a ceramic, plastic, or other organic material and contains one or more wiring layers (not shown) that electrically connect device 51 to other components located either on or off the mounting substrate 52. Substrate 52 may include a semiconductor package, a multi-chip module, a printed circuit board, or the like.

In one embodiment, cooling channel housing 58 is made of a metal matrix composite. The metal matrix composite is substantially lighter in weight than conventional metal materials. In addition, the metal matrix composite has a coefficient of thermal expansion that more nearly matches that of substrate 52, as compared to conventional metal materials, such as copper. Housing 58 may be attached to substrate by any of a number of attachment methods known in the art. In one embodiment, substrate 52 and channel housing 58 are attached by a lead/tin/antimony (Sn/Ag/Sb) solder composition. Since heat generated by device 51 is transferred from the back-side 56 of substrate 52 directly into the cooling medium passing through channel 60, there is no need for the channel housing to be constructed of a high thermally conductive material. This offers a distinct advantage over prior art cooling methods and allows for greater flexibility in the selection of channel housing materials. For example, since channel housing 58 need not be constructed of a highly thermally conductive material, a material having a coefficient of thermal expansion similar to that of substrate 52 may be selected. This reduces stresses at the channel housing 58 and substrate 52 interface. By reducing these stresses, the likelihood of cracks forming along the interface is also reduced, which enhances the overall reliability of the cooling apparatus. In addition, lighter weight materials, such as metal matrix composites, may be selected.

The cooling medium that is passed through channel 60 is generally water, but may comprises any of a variety of other cooling substances.

Figure 3B:
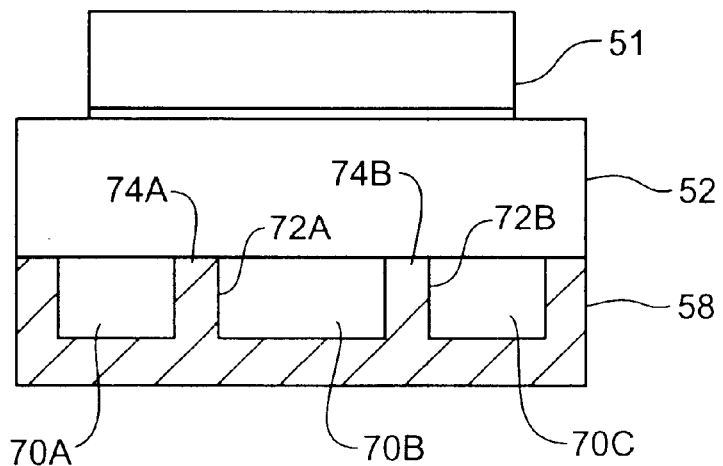
FIG. 3B illustrates a cooling apparatus in accordance with another embodiment of the present invention.

In FIG. 3A, cooling channel 60 is shown as a single channel having a uniform cross-sectional area. As shown in FIG. 3B, the cooling channel may be divided into a plurality of substantially parallel flow channels 70a, 70b and 70c. Channels 70a–c are divided by wall sections 72a and 72b. Wall sections 72a and 72b may be integrally formed with channel housing 58, or may be separately attached thereto. Each wall section has a top surface 74a and 74b that is in abutting engagement with and/or attached to the back-side surface 56 of substrate 52. Wall sections 72a and 72b provide additional support between substrate 52 and channel housing 58. In addition to increasing the area available for attaching substrate 52 to housing 58, wall sections 72a and 72b reduce the deflection of the substrate caused by the pressure force of the cooling medium acting upon it. Since substrate 52 is typically made of a brittle material, such as ceramic, the addition of one or more wall sections within the cooling channel reduces the average distance of deflection of the substrate, thus, inhibiting cracking of the substrate. It is to be understood that the present invention is not limited by the number of cooling channels, nor is it limited to channels having a uniform cross-sectional area.

Figure 4:
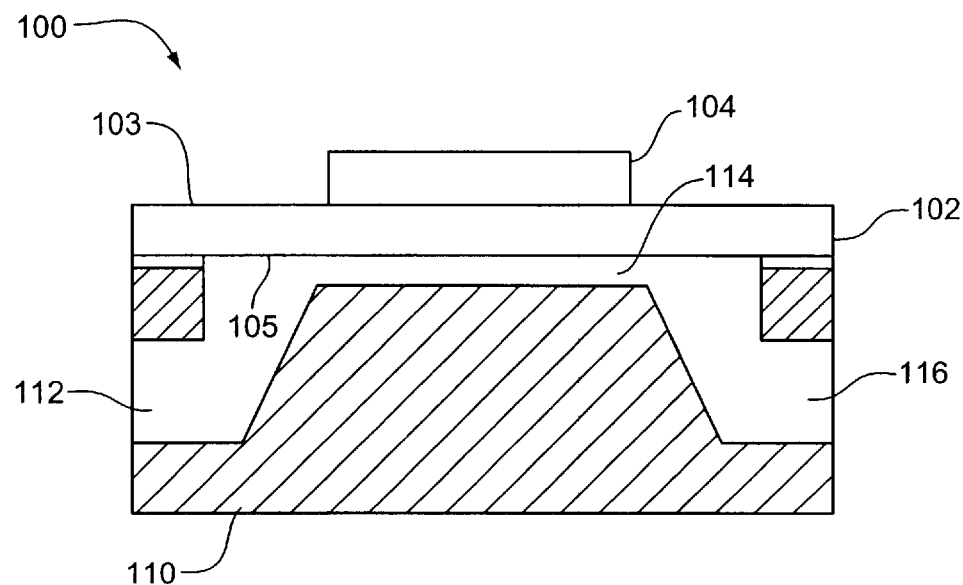
FIG. 4 shows a side view of a cooling module in one embodiment of the present invention.
Figure 5A:
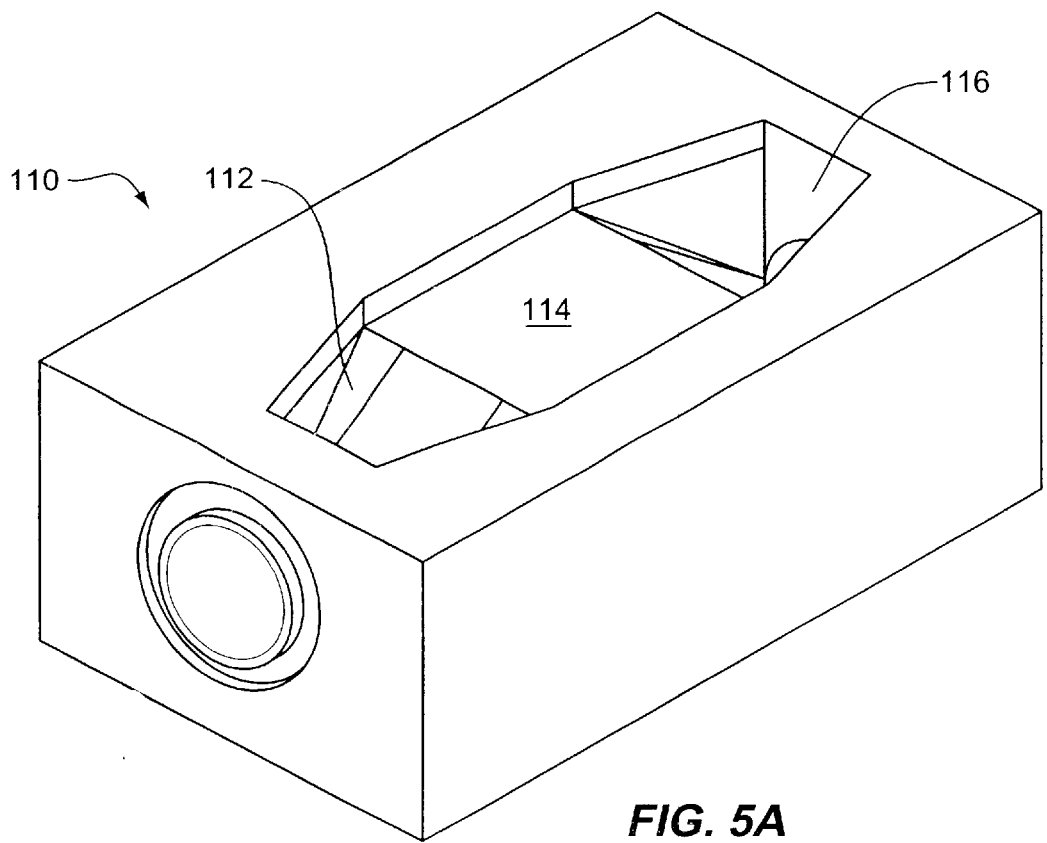
FIG. 5A illustrates a perspective view of the cooling module depicted in FIG. 4.
Figure 5B:
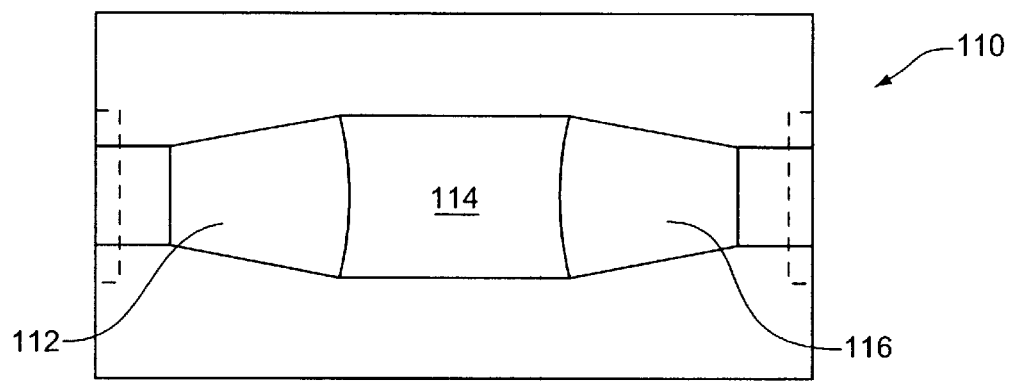
FIG. 5B illustrates a top view of the cooling module depicted in FIG. 4 and FIG. 5A.

Turning now to FIG. 4, a cross-sectional side view of a heat removal apparatus 100 in another embodiment of the present invention is shown. The cooling apparatus includes a heat generating device 104 that is thermally coupled to a top-side surface 103 of a substrate 102. A cooling module 110 containing a fluid flow channel is attached to the back-side surface 105 of substrate 102. The flow channel of cooling module 110 includes a first section 112, a second section 114, and a third section 116. The first section 112 of the cooling channel is located at the inlet of the cooling module and is followed by the second section 114 which has a reduced flow area. The third section 116 is located at the outlet of module 110 at a point downstream of second section 114. Section 114, is positioned adjacent the back-side surface of substrate 102 at a location opposite heat generating device 104. The cross-sectional flow area of the second channel section is less than the cross-sectional flow area of the first and third channel sections. The reduced channel flow area within section 114 causes the velocity of the cooling medium to be increased within the section. Since the convection heat transfer coefficient at the channel and substrate interface is proportional to the velocity of the cooling medium passing through the channel, the increase in the cooling medium velocity within channel section 114 effectively enhances the transfer of heat from the back-side surface 105 of substrate 102 into the cooling medium. By strategically locating the high velocity section of the cooling flow channel opposite those devices located along the top-side of substrate 102 requiring the most cooling, the present invention provides a cooling apparatus in which both the thermal and liquid pressure differential requirements of the system may be optimally balanced in order to produce a thermally efficient and structurally reliable cooling system. The ability to strategically place high velocity sections of the cooling channel results in a reduced pressure drop across the cooling apparatus. FIGS. 5A and 5B show a perspective view and top view of the cooling module 110 depicted in FIG. 4, respectively.

Figure 6:
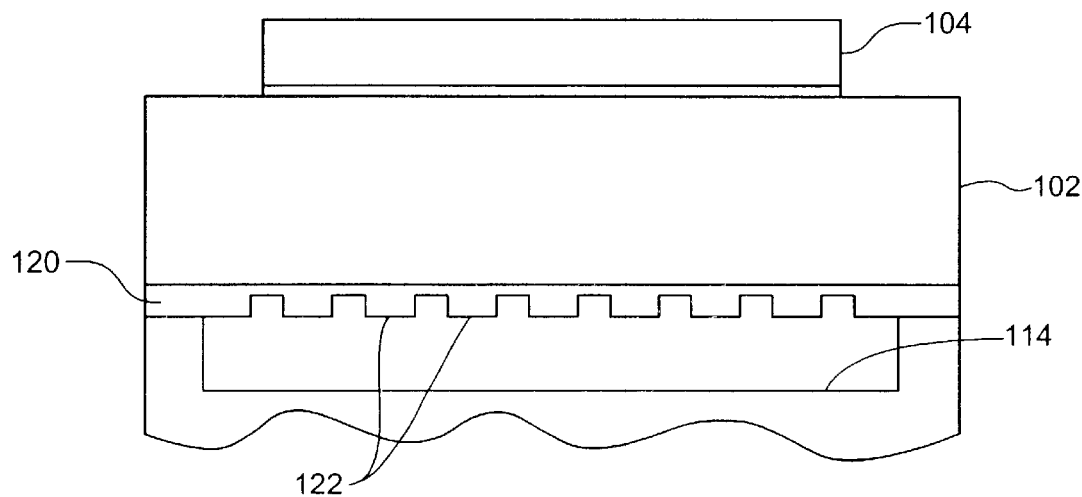
FIG. 6 illustrates another embodiment of the present invention.

In one embodiment, substrate 102 is made of a ceramic material and has a thickness of approximately 25 to 40 mils. In some instances, substrate 102 may include a copper sheet 120, or other high thermally conductive material, that is attached to back-side surface 105 as shown in FIG. 6. In order to increase the heat transfer area along the back-side surface of the substrate, copper sheet 120 may be etched or machined to produce a plurality of fins 122 that extend longitudinally along the back-side surface of substrate 102. By increasing the heat transfer area, the heat removal capacity of the apparatus is also increased.

Figure 7:
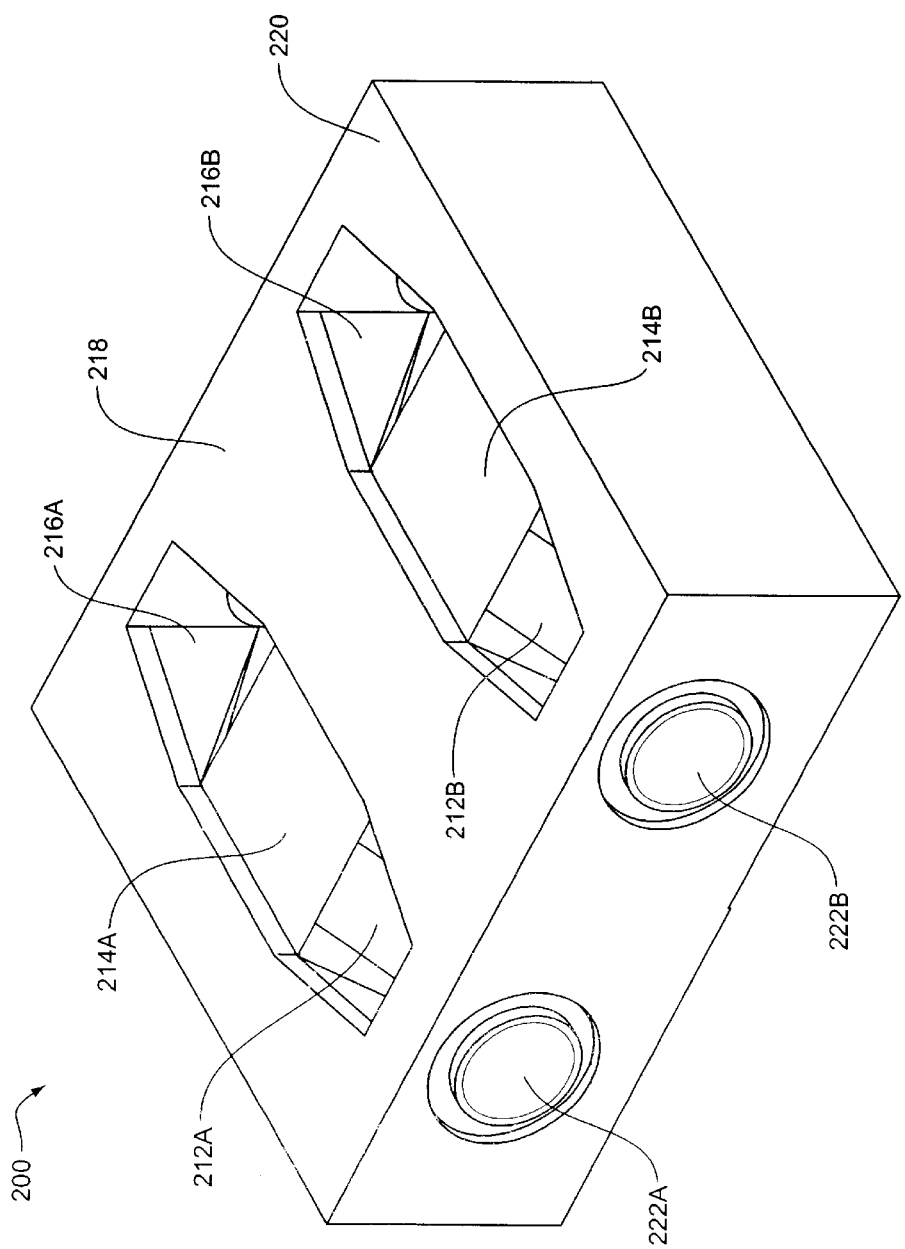
FIG. 7 illustrates a cooling module in accordance with another embodiment of the present invention.
Figure 8:
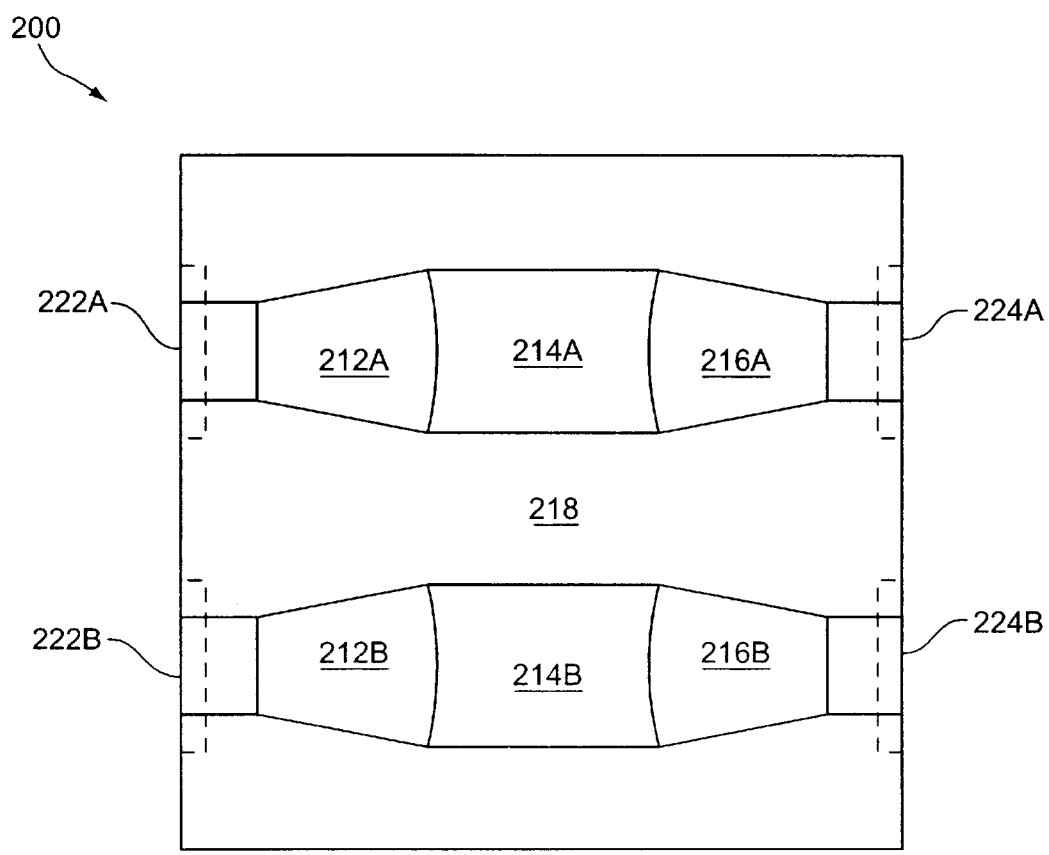
FIG. 8 is a top view of the cooling module shown in FIG. 7.

With reference to FIGS. 7 and 8, a cooling module 200 in accordance with another embodiment of the invention is shown. Cooling module 200 includes two separate flow channels that are aligned substantially parallel to one another. Each flow channel is divided into three sections; a first section 212a and 212b, a second section 214a and 214b, and a third section 216a and 216b. Each flow channel has an inlet opening 222a and 222b, and an outlet opening 224a and 224b positioned at opposite ends of the cooling module. Each of the flow channels is characterized by a reduced flow area region within sections 214a and 214b. In accordance with the present invention, a multi-chip module, printed circuit board, semiconductor package, or similar type substrate containing one or more heat generating devices is attached to the top surface 220 of the cooling module. As previously discussed, the higher heat generating components are typically located along the top surface of the substrate just above the reduced flow areas of the cooling fluid channels.

The top surface 220 of cooling module 200 includes a center section 218 that separates the cooling channel openings along the top surface of the module. The center section 218 of surface 220 permits a substrate to be bonded to the cooling module 200 at both the periphery and center of the substrate. The pressure of the cooling medium passing through cooling module channels acts upon the substrate in a manner that causes the substrate to bow. The ability to attach the center of the substrate to the center surface section 218 of the cooling module decreases the substrate's anti-plane strain and stress caused by the cooling medium pressure acting upon the back-side surface of the substrate as opposed to attaching the substrate to the module only around the periphery of the substrate. Although cooling module 200 is shown having two parallel cooling flow channels, it is important to note that the present invention is not limited to such an implementation. For instance, a cooling module containing three or more parallel flow channels may also be used.

In one embodiment, cooling module 200 has a length and width of approximately 2 inches. Channel sections 212a, 212b, 216a and 216b each have a length of approximately 0.65 inches and a width of approximately 0.5 inches. The height of channel sections 214a and 214b is typically in the range of 40 to 60 mils. In such an embodiment, the flow rate of the cooling medium through each channel is approximately 1 to 2 gallons per minute. It is to be understood that dimensions of cooling module 200 and the flow rate of the cooling medium passing through the module may vary considerably from one application to another.

Figure 9:
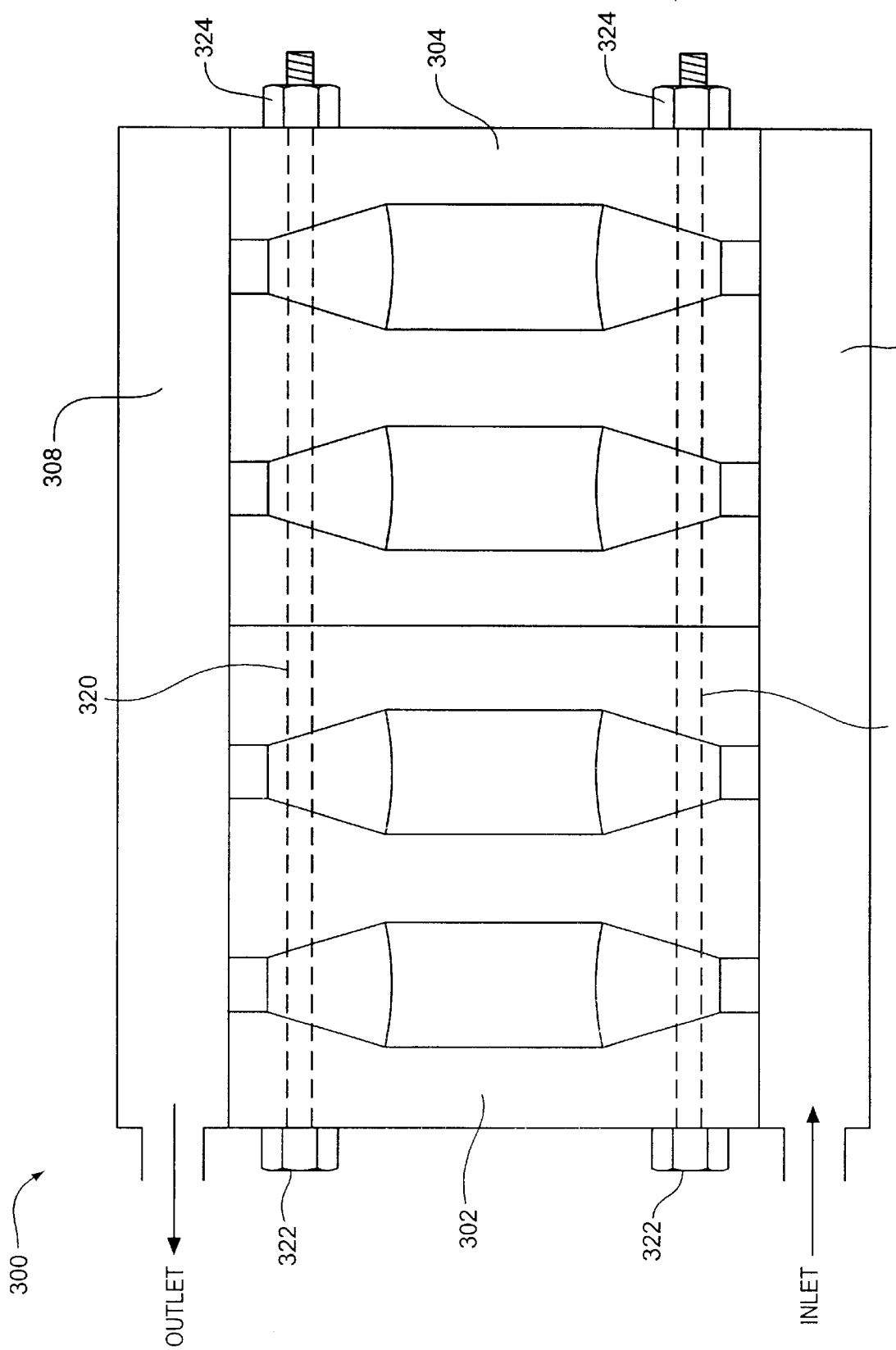
FIG. 9 shows a plurality of cooling modules arranged in a parallel configuration.

In some instances, it may be desirable to combine two or more cooling modules of the present invention, in a parallel or serial configuration. FIG. 9 illustrates a cooling apparatus 300 in which two cooling modules 302 and 304 are arranged in a parallel configuration. An inlet manifold 306 is provided at the inlet side of cooling modules 302 and 304 to direct a cooling medium into each of the cooling module's flow channels. An outlet manifold 308 is provided along the opposite side of modules 306 and 308 for directing the discharged cooling medium away from the modules. In one embodiment, through holes 320 are provided within each of cooling modules 302 and 304 to facilitate the attachment of the modules with threaded bolts 322 and nuts 324. Modules 302 and 304 may also be attached by any of a variety of clamping or bonding techniques.

Figure 10:
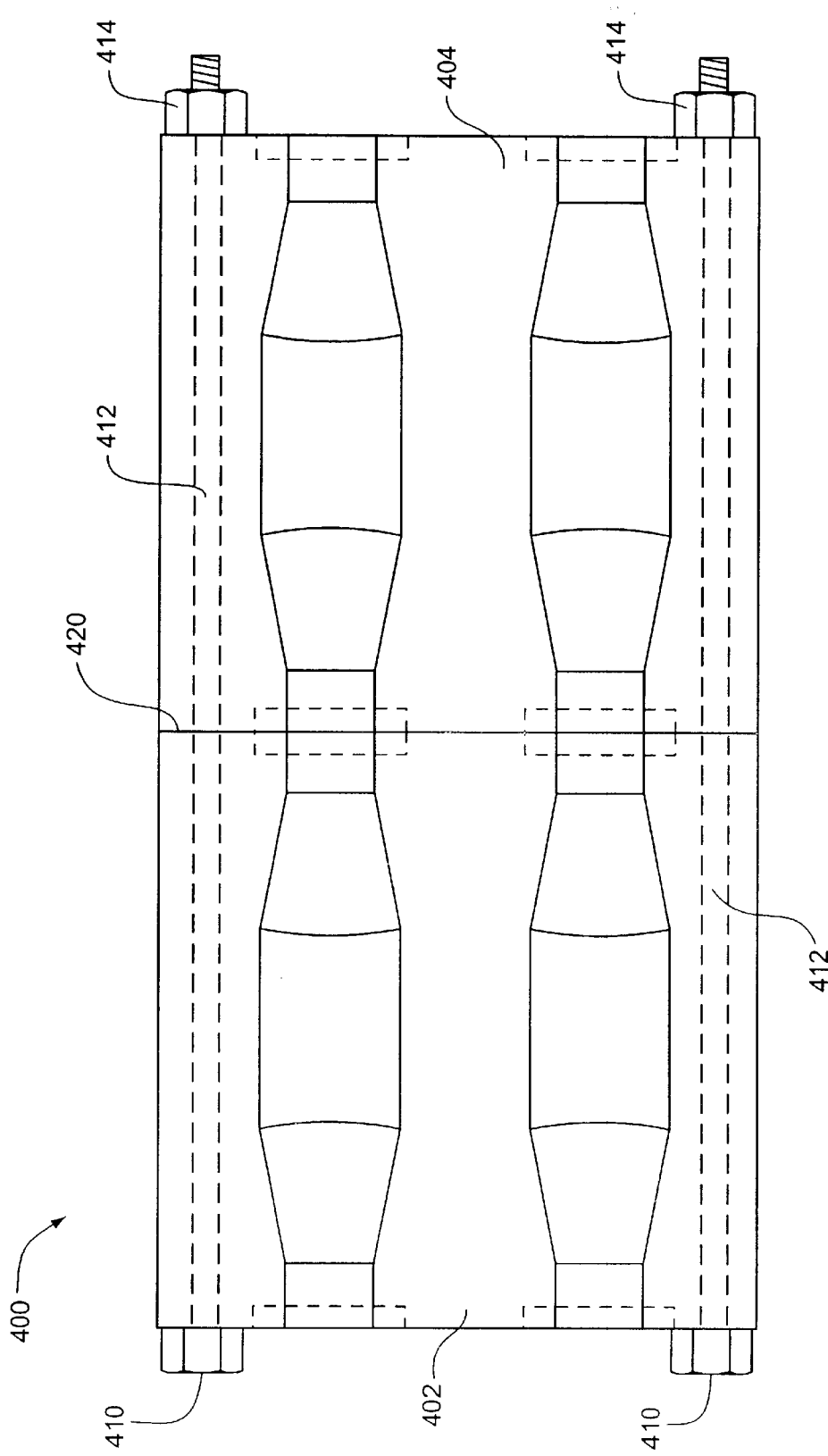
FIG. 10 shows a plurality of cooling modules arranged in a serial configuration.

FIG. 10 shows a cooling apparatus 400 wherein two cooling modules 402 and 404 are attached in a serial configuration. In one embodiment, modules 402 and 404 contain a set of through holes 412 that extend along the length of the module. Threaded bolts 410 are positioned in the through holes and secured by nuts 414. Gaskets, o-rings, or other sealing means, are provided at the interface of the cooling modules. In one embodiment, o-rings are provided within the annular recesses of the modules' inlet and outlet ports.

Figure 11:
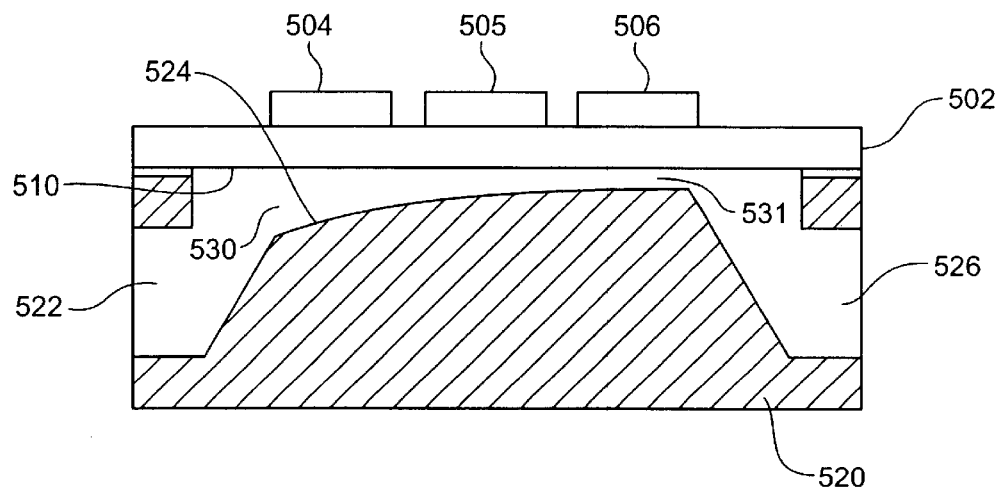
FIG. 11 illustrates a cooling module in accordance with another embodiment of the present invention.

As previously noted, two or more semiconductor devices are commonly housed on a single substrate. One such example is a multi-chip module. FIG. 11 shows a substrate 502 having three heat generating devices 504, 505 and 506 positioned along the top surface of the substrate. Substrate 502 is attached to a cooling module 520 that includes a flow channel that is formed at least partially by the back-side surface 510 of substrate 502. The flow channel of cooling module 520 includes a first section 522, a second section 524, and a third section 526. The first section 522 of the flow channel is located at the inlet of the cooling module and is followed by the second section 224 which has a reduced and varying flow area. The third section 526 is located at the outlet of module 520 at a point downstream of second section 524. Section 524, is positioned adjacent the back-side surface 510 of substrate 502 at a location opposite heat generating devices 504, 505 and 506. As previously discussed, the reduced flow area of section 524 causes the velocity of the cooling medium to increase, thus enhancing the transfer of heat from the back-side surface 510 of substrate 502 into the cooling medium.

Flow channel section 524 of cooling module 520 is characterized by a varying flow area. As depicted in FIG. 11, the cross-sectional flow area of channel section 524 varies from a larger first area at location 530 to a smaller second area at location 531. The varying flow area of flow channel section 524 acts to offset the effect of the thickening thermal boundary layer of the cooling medium as it gathers heat from the heat generating devices located on the top surface of substrate 502. By increasing the velocity of the cooling medium as it passes through channel section 524, the heat transfer rate between the backside surface of the adjoining substrate and the cooling medium will increase along the length of section 524. A key advantage of the present invention lies in the ability to optimize the geometry of the cooling channel in order to maintain the temperatures of heat dissipating devices constant and uniform independent of the their position along the channel.

Figure 12:
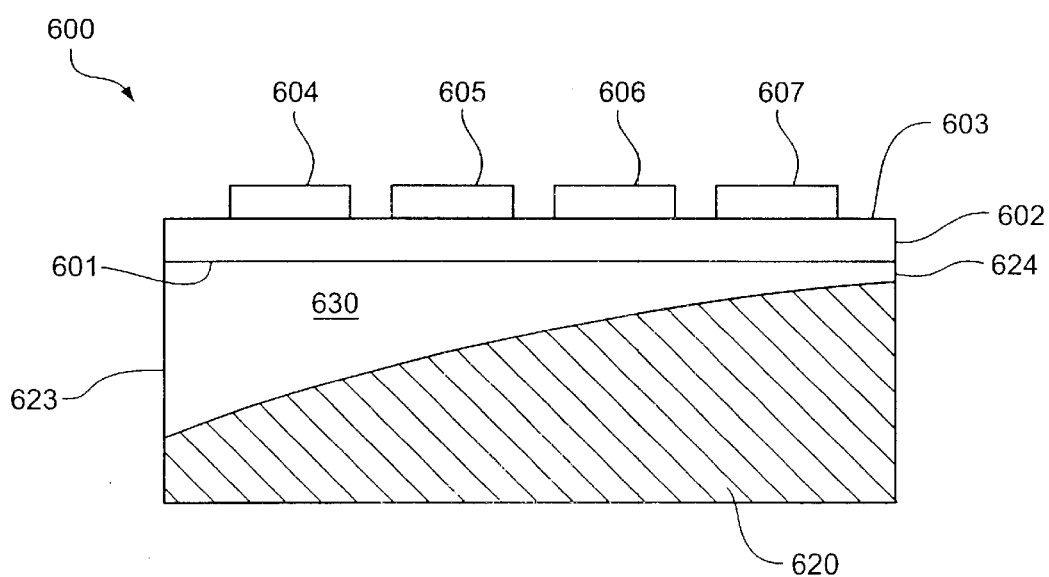
FIG. 12 illustrates a cooling module in accordance with yet another embodiment of the present invention.

An alternative implementation of the varying flow area concept described above is shown in FIG. 12. In FIG. 12 a plurality of heat generating devices 604–607 are thermally coupled to the top-side surface 603 of a substrate 602. Substrate 602 is attached to a cooling module 620. The back-side surface 601 of substrate 602 and cooling module 620 define a flow channel 630 having an inlet 623 and an outlet 624. The flow area of channel 630 varies from a larger first area at inlet 623 to a smaller second flow area at outlet 624. As a cooling medium is passed through channel 630, the velocity of the cooling medium is gradually increased to offset the effect of a thickening thermal boundary layer.

Thus, what has been described is an apparatus for removing heat from the back-side of a substrate housing one or more heat dissipating devices. In the foregoing detailed description, the apparatus of the present invention has been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A cooling device comprising;
a semiconductor package substrate having a top-side and back-side surface, the top-side surface having a semiconductor chip mounted thereto, and the back-side surface being opposite the top-side surface; and
a cooling channel housing, the channel housing in conjunction with at least a portion of the back-side surface defining a right and a left flow channel, the left and right flow channels being substantially parallel to each other and being separated by a dividing wall formed in the channel housing, the left flow channel comprising a left inlet section, a left heat transfer section, and a left outlet section,
the left heat transfer section having a cross-sectional area perpendicular to the intended direction of flow smaller than the cross-sectional areas perpendicular to the flow direction of the left inlet and left outlet sections,
the right flow channel comprising a right inlet section, a right heat transfer section, and a right outlet section,
the right heat transfer section having a cross-sectional area perpendicular to the intended direction of flow smaller than the cross-sectional areas perpendicular to the flow direction of the right inlet and right outlet sections.

2. The cooling device of claim 1, wherein the channel housing is fabricated from a metal-matrix composite material.

3. The cooling device of claim 2, wherein the metal-matrix composite material has a coefficient of thermal expansion similar to that of the semiconductor package substrate.

4. The cooling device of claim 1, wherein either or both the left and right heat transfer sections are located adjacent a portion of the backside surface that is opposite the semiconductor chip.

5. The cooling device of claim 1 wherein thermally conductive fins are disposed on the portion of the backside surface that is opposite the semiconductor chip.

6. The cooling device of claim 5, wherein the thermally conductive fins comprises copper.

7. The cooling device of claim 1, wherein at least one bolt hole passes through the cooling channel housing, the at least one hole being substantially parallel with the plane of the back-side surface, and not impinging on either the left or right flow channels.

8. The cooling device of claim 7, wherein the at least one bolt hole is substantially parallel with an intended direction of coolant flow.

9. The cooling device of claim 7, wherein the at least one bolt hole is substantially perpendicular to an intended direction of coolant flow.

10. The cooling device of claim 7, wherein an o-ring or a gasket circumscribes one or more openings of the outlets or inlets sections of the right and left flow channels at one or more side surfaces of the cooling channel housing.

11. A cooling apparatus comprising:
a first cooling device, the first cooling device comprising,
a first semiconductor package substrate having a first top-side and first back-side surface, the first top-side surface having a first semiconductor chip mounted thereto, and the first back-side surface being opposite the first top-side surface; and
a first cooling channel housing, the first channel housing in conjunction with at least a port ion of the first back-side surface defining a first right and a first left flow channel, the first left and first right flow channels being substantially parallel to each other and being separated by a first dividing wall formed in the first channel housing,
the first left flow channel comprising a first left inlet section, a first left heat transfer section, and a first left outlet section,
the first left heat transfer section having a cross-sectional area perpendicular to the intended direction of flow smaller than the cross-sectional areas in the intended direction of flow of the first left inlet and first left outlet sections,
the first right flow channel comprising a first right inlet section, a first right heat transfer section, and a first right outlet section,
the first right heat transfer section having a cross-sectional area perpendicular to the intended direction of flow smaller than the cross-sectional areas in the intended direction of flow of the first right inlet and first right outlet sections,
the first cooling channel housing also having at least one first bolt hole formed there through, the at least one first hole being substantially parallel with the plane of the first back-side surface, and not impinging on either the first left or first right flow channels;
a second cooling device, the second cooling device comprising,
a second semiconductor package substrate having a second top-side and second back-side surface, the second top-side surface having a second semiconductor chip mounted thereto, and the second back-side surface being opposite the second top-side surface; and
a second cooling channel housing, the second channel housing in conjunction with at least a portion of the second back-side surface defining a second right and a second left flow channel, the second left and second right flow channels being substantially parallel to each other and being separated by a second dividing wall formed in the second channel housing,
the second left flow channel comprising a second left inlet section, a second left heat transfer section, and a second left outlet section,
the second left heat transfer section having a cross-sectional area perpendicular to the intended direction of flow smaller than the cross-sectional areas in the intended direction of flow of the second left inlet and second left outlet sections,
the second right flow channel comprising a second right inlet section, a second right heat transfer section, and a second right outlet section ,
the second right heat transfer section having a cross-sectional area perpendicular to the intended direction of flow smaller than the cross-sectional areas in the intended direction of flow of the second right inlet and second right outlet sections, the second cooling channel housing also having at least one second bolt hole formed there through, the at least one second hole being substantially parallel with the plane of the second back-side surface, and not impinging on either the second left or second right flow channels; and a bolt, the bolt passing through the at least first one bolt hole and the at least second bolt hole, the bolt being secured to join the first and second cooling devices together.

12. The cooling apparatus of claim 11, wherein first left and first right openings of the first left and first right outlet sections formed at a first side surface of the first cooling channel housing of the first cooling device mate up respectively against the second left and second right openings of the second left and second right inlet sections formed at a second side surface of the second cooling channel housing of the second cooling device, permitting a continuous flow of cooling fluid.

13. A cooling device comprising:

a semiconductor package substrate having a top-side and back-side surface, the top-side surface having a semiconductor chip mounted thereto, and the back-side surface being opposite the top-side surface; and a cooling channel housing, the channel housing in conjunction with at least a portion of the back-side surface defining a flow channel, the flow channel comprising an inlet section, a heat transfer section, and an outlet section, the heat transfer section having a smaller cross-sectional area than a cross-sectional area of the inlet and outlet sections, the cooling channel housing having at least one bolt hole formed there through, the at least one bolt hole being substantially parallel with the plane of the back-side surface, and not impinging on either the left or right flow channels.

14. The cooling device of claim 13, wherein the at least one bolt hole is substantially parallel with the intended direction of coolant flow.

15. The cooling device of claim 13, wherein the at least one bolt hole is substantially perpendicular to the direction of coolant flow.

16. The cooling device of claim 13, wherein an o-ring or a gasket circumscribes one or more opening of the outlet or inlet sections of the flow channel at one or more side surfaces of the cooling channel housing.

17. The cooling device of claim 13, wherein the channel housing is fabricated from a metal matrix composite.

18. The cooling device of claim 13, wherein the heat transfer section is located adjacent a portion of the backside surface that is opposite the semiconductor chip.

* * * * *